United States Patent
Demkov et al.

(10) Patent No.: US 9,293,697 B2
(45) Date of Patent: Mar. 22, 2016

(54) EFFICIENTLY INJECTING SPIN-POLARIZED CURRENT INTO SEMICONDUCTORS BY INTERFACING CRYSTALLINE FERROMAGNETIC OXIDES DIRECTLY ON THE SEMICONDUCTOR MATERIAL

(71) Applicant: Board of Regents, The University of Texas System, Austin, TX (US)

(72) Inventors: Alexander A. Demkov, Austin, TX (US); Agham-Bayan S. Posadas, Austin, TX (US)

(73) Assignee: Board of Regents, The University of Texas System, Austin, TX (US)

( * ) Notice: Subject to any disclaimer, the term of this patent is extended or adjusted under 35 U.S.C. 154(b) by 0 days.

(21) Appl. No.: 14/640,565

(22) Filed: Mar. 6, 2015

(65) Prior Publication Data

US 2015/0333253 A1     Nov. 19, 2015

Related U.S. Application Data

(62) Division of application No. 13/465,185, filed on May 7, 2012, now Pat. No. 9,023,662.

(60) Provisional application No. 61/484,080, filed on May 9, 2011.

(51) Int. Cl.
```
H01L 21/20       (2006.01)
H01L 43/10       (2006.01)
H01L 43/02       (2006.01)
```

(52) U.S. Cl.
CPC ............. *H01L 43/10* (2013.01); *H01L 43/02* (2013.01)

(58) Field of Classification Search
CPC .............. H01L 21/20; H01L 21/02381; H01L 21/02488; H01L 21/02505; H01L 21/02513; H01L 21/8258; H01L 29/02; H01L 29/04; H01L 43/02; H01L 43/10
USPC ............................................................ 438/3
See application file for complete search history.

(56) References Cited

U.S. PATENT DOCUMENTS

| | | |
|---|---|---|
| 5,450,812 A | 9/1995 | McKee et al. |
| 5,804,323 A | 9/1998 | McKee et al. |

(Continued)

OTHER PUBLICATIONS

Rumpf et al, "Silicon/Metal Hybrid Nanosystem with Tailored Magnetic Properties in Two Characteristic Field Regions," 214th ECS Meeting, vol. 16, Issue 3, Oct. 12-Oct. 17, 2008.

(Continued)

*Primary Examiner* — Michael Lebentritt
(74) *Attorney, Agent, or Firm* — Robert A. Voigt, Jr.; Winstead, P.C.

(57) ABSTRACT

A spintronic device and a method for making said spintronic device. The spintronic device includes an epitaxial crystalline ferromagnetic oxide formed directly on the semiconductor material thereby allowing spin-polarized current to be efficiently injected from the ferromagnetic oxide into the semiconductor material. A host crystal lattice includes multiple sets of stacked oxide layers of material A and B of a perovskite structure with a formula of $ABO_3$. After an oxide layer of B is grown, magnetic ions are introduced to intermix with the B material, which may replace some of the ions of the B material. The process of growing additional stacked oxide layers of material A and B and introducing further magnetic ions after the deposition of the oxide layer of B continues until enough magnetic ions are sufficiently close to one another that they align in the same direction thereby forming a ferromagnetic oxide on the semiconductor material.

14 Claims, 4 Drawing Sheets

(56) References Cited

U.S. PATENT DOCUMENTS

| | | | |
|---|---|---|---|
| 5,821,199 | A | 10/1998 | McKee et al. |
| 5,856,033 | A | 1/1999 | McKee et al. |
| 5,876,866 | A | 3/1999 | McKee et al. |
| 6,355,953 | B1 | 3/2002 | Kirczenow |
| 6,652,989 | B2 | 11/2003 | McKee et al. |
| 7,534,626 | B2 | 5/2009 | Parkin |
| 7,803,707 | B2 | 9/2010 | Jin et al. |
| 8,680,632 | B2 | 3/2014 | Daibou et al. |
| 8,680,633 | B1 | 3/2014 | Kato et al. |
| 8,895,162 | B2 | 11/2014 | Nishiyama et al. |
| 9,023,662 | B2 * | 5/2015 | Demkov .............. G11C 11/16 257/E21.002 |
| 2004/0094801 | A1 | 5/2004 | Liang et al. |
| 2010/0109712 | A1 | 5/2010 | Zaliznyak et al. |
| 2012/0286383 | A1 | 11/2012 | Demkov et al. |
| 2014/0261604 | A1 | 9/2014 | Jha et al. |

OTHER PUBLICATIONS

Johnston, Hamish, "Electrons Hold Their Spin in Silicon," http://physicsworld.com/cws/article/news/2007/may/17/electrons-hold-their-spin-in-silicon, May 17, 2007.

Jonker et al., "Electrical Spin-Injection into Silicon From a Ferromagnetic Metal/Tunnel Barrier Contact," http://www.nature.com/nphys/journal/v3/n8/full/nphys673.html, Jul. 15, 2007.

Granitzer et al., "Investigation of a Mesoporous Silicon Based Ferromagnetic Nanocomposite," Nanoscale Research Letters, vol. 5, pp. 374-378, Nov. 15, 2009.

Magnano et al., "Ferromagnetic and Ordered MnSi(111) Epitaxial Layers," http://apl.aip.org/resource/1/applab/v96/i15/p152503_s1?isAuthorized=no, Apr. 14, 2010.

Akiyama et al., "Epitxaxial Growth of Ferromagnetic Iron Silicide Thin Films on Silicon with Yttria-Stabilized Zirconia Buffer Layer," http://jjap.jsap.jp/link?JJAP/47/577/, Jan. 22, 2008.

Appelbaum et al., "Electronic Measurement and Control of Spin Transport in Silicon," http://www.nature.com/nature/journal/v447/n7142/abs/nature05803.html, May 17, 2007.

Posadas et al., "Epitaxial Integration of Ferromagnetic in Correlated Oxide LaCoO3 with Si (100)," Applied Physics Letters 98, 053104, Feb. 1, 2011.

McKee et al., "Crystalline Oxides on Silicon: The First Five Monolayers," Phys. Rev. Lett. 81, 3014, Oct. 5, 1998.

McKee et al., "Physical Structure and Inversion Charge at a Semiconductor Interface with a Crystalline Oxide," Science, vol. 293, No. 5529, pp. 468-471, Jul. 20, 2001.

McKee et al., "The Interface Phase and the Schottky Barrier for a Crystalline Dielectric on Silicon," Science, vol. 300, No. 5626, pp. 1726-1730, Jun. 13, 2003.

* cited by examiner

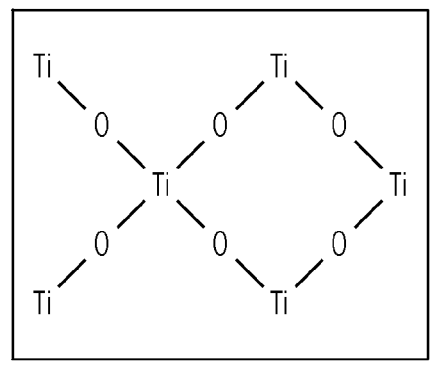
FIG. 3A
FIG. 3B
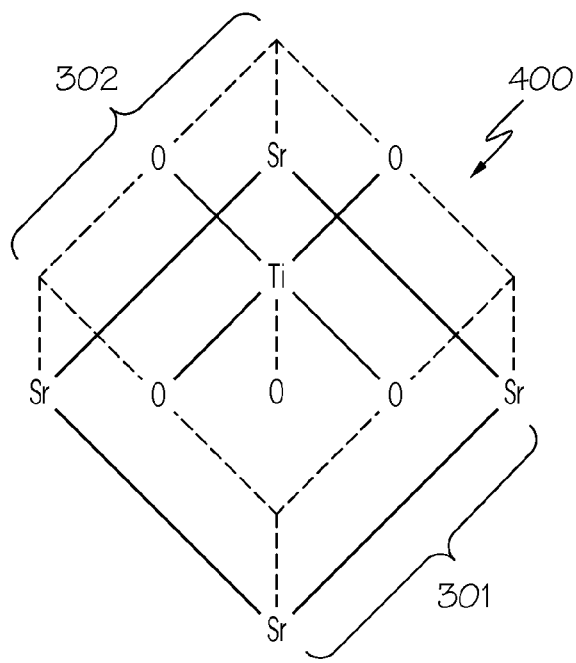
FIG. 4

EFFICIENTLY INJECTING SPIN-POLARIZED CURRENT INTO SEMICONDUCTORS BY INTERFACING CRYSTALLINE FERROMAGNETIC OXIDES DIRECTLY ON THE SEMICONDUCTOR MATERIAL

CROSS-REFERENCE TO RELATED APPLICATIONS

This application is related to the following commonly owned U.S. Patent Application:

Provisional Application Ser. No. 61/484,080, "Efficiently Injecting Spin-Polarized Current into Semiconductors by Interfacing Crystalline Ferromagnetic Oxides Directly on Silicon," filed May 9, 2011, and claims the benefit of its earlier filing date under 35 U.S.C. §119(e).

GOVERNMENT INTERESTS

This invention was made with government support under Grant No. N00014-09-1-0908 awarded by the Office of Naval Research. The U.S. Government has certain rights in the invention.

TECHNICAL FIELD

The present invention relates generally to spintronic devices, and more particularly to efficiently injecting spin-polarized current into semiconductors without significant losses by interfacing crystalline ferromagnetic oxides directly on the semiconductor material.

BACKGROUND

Spintronic devices are electronic circuits that could use both the charge and spin of charge carriers, most typically electrons, to transmit, store and process information. There are many applications for spintronic devices. Some examples of spintronic devices are the family of devices which exploit giant magnetoresistance (GMR). Spintronic devices may be used, for example, in magnetic field sensors, magnetic memories, spin-based transistors, semiconductor quantum interference devices based on electron spin, classical and quantum computers, heads for reading data from magnetic storage media or the like.

An impediment to the availability of commercially useful spintronic devices is that it has so far not been practical to generate strongly spin-polarized currents in semiconductor materials (often referred to as "spin injection"). Spin-polarized currents of electrons can be generated in ferromagnetic materials because the magnetic field of the material (augmented by many-body effects) interacts with the spins of electrons. Thus, the spin-up and spin-down states of electrons in a ferromagnetic material have different energy levels. The majority of electrons are in states such that their spins are aligned with the local magnetic field of the material. In such materials, electrons occupy the majority and minority spin states asymmetrically.

It is possible, in principle, to take advantage of this asymmetry to create a spin-polarized current in a non-ferromagnetic material (e.g., semiconductor) by creating a spin-polarized electronic current in a ferromagnetic material and causing the current to flow from the ferromagnetic material into an adjacent non-ferromagnetic material by way of an interface. For example, if a layer of ferromagnetic metal is bonded to a piece of silicon, the electrons can be made to flow from the magnet into silicon by applying a voltage. Unfortunately, the electrons lose their polarization as they cross the interface between the two materials thanks to an "impedance mismatch" between the metal and the semiconductor. As a result, the efficiency of spin injection from ferromagnetic metals into semiconductors has been very low.

This problem has been circumvented in semiconductor materials, such as gallium arsenide, by allowing the spin-polarized electrons to "tunnel" across the interface, thus avoiding the impedance mismatch. However, such a process requires a very thin and abrupt interface between the metal and the semiconductor, which cannot currently be achieved when growing layers of ferromagnetic metal on semiconductor material, such as silicon.

BRIEF SUMMARY

In one embodiment of the present invention, a method for forming a ferromagnetic oxide material on a semiconductor comprises introducing magnetic ions into a host crystal lattice, where the host crystal is in contact with a semiconductor material. The host crystal lattice is a perovskite oxide structure with a formula of $ABO_3$, where A comprises an alkaline earth metal or a group IIIA metal and where B comprises one of the metals from groups IVA, VIIIA and IIIB. The host crystal lattice comprises a first oxide layer of A and a first oxide layer of B, where the first oxide layer of B is grown after the first oxide layer of A. The magnetic ions are introduced after the first oxide layer of B is grown in the host crystal lattice. The method further comprises introducing further magnetic ions into the host crystal lattice after adding each set of additional oxide layers of A and B in the host crystal lattice until a number of magnetic ions align in a same direction thereby forming a ferromagnetic oxide on the semiconductor material.

In another embodiment of the present invention, a method for forming a ferromagnetic material on a semiconductor comprises growing a first layer of strontium oxide on a semiconductor material. The method additionally comprises growing a first layer of titanium dioxide on the first layer of strontium oxide. In addition, the method comprises introducing a first set of magnetic ions after the first layer of the titanium dioxide is grown on the first layer of strontium oxide to intermix with titanium ions in the first layer of titanium dioxide whereby one or more of the first set of magnetic ions replace one or more titanium ions in the first layer of the titanium dioxide. Furthermore, the method comprises growing a second layer of strontium oxide on the first layer of titanium dioxide following the introduction of the first set of magnetic ions. The method further comprises growing a second layer of titanium dioxide on the second layer of strontium oxide. The method additionally comprises introducing a second set of magnetic ions after the second layer of the titanium dioxide is grown on the second layer of strontium oxide to intermix with titanium ions in the first and second layers of titanium dioxide whereby one or more of the second set of magnetic ions replace one or more titanium ions in the first and second layers of the titanium dioxide. In addition, the method comprises continuing to grow additional layers of strontium oxide and titanium dioxide and continuing to introduce magnetic ions after the additional layer of titanium dioxide is grown until a number of magnetic ions align in a same direction thereby forming a ferromagnetic oxide on the semiconductor material.

In one embodiment of the present invention, a spintronic device comprises a semiconductor material and an epitaxial layer of crystalline ferromagnetic oxide in contact with the semiconductor material.

In another embodiment of the present invention, a spintronic device comprises a semiconductor material. The spintronic device further comprises a silicon dioxide layer in contact with the semiconductor material. In addition, the spintronic device comprises an epitaxial layer of crystalline ferromagnetic oxide in contact with the silicon dioxide layer, where the silicon dioxide layer is formed after the epitaxial layer of crystalline ferromagnetic oxide is formed.

The foregoing has outlined rather generally the features and technical advantages of one or more embodiments of the present invention in order that the detailed description of the present invention that follows may be better understood. Additional features and advantages of the present invention will be described hereinafter which may form the subject of the claims of the present invention.

BRIEF DESCRIPTION OF THE SEVERAL VIEWS OF THE DRAWINGS

A better understanding of the present invention can be obtained when the following detailed description is considered in conjunction with the following drawings, in which:

FIGS. 3A and 3B illustrate the planes of strontium oxide and titanium dioxide, respectively, that are formed in a host crystal lattice in accordance with an embodiment of the present invention; and FIG. 4 illustrates a host crystal lattice used as a host for forming an epitaxial crystalline ferromagnetic oxide on the semiconductor material in accordance with an embodiment of the present invention.

DETAILED DESCRIPTION

The present invention comprises a spintronic device and a method for making said spintronic device. The spintronic device includes an epitaxial crystalline ferromagnetic oxide formed directly on the semiconductor material (e.g., silicon). The ferromagnetic oxide is formed directly on the semiconductor material by introducing magnetic ions in a host crystal lattice. The host crystal lattice may include multiple sets of stacked oxide layers of a perovskite structure with a formula of $ABO_3$, where A includes an alkaline earth metal or a group IIIA metal and B includes one of the metals from groups IVA, VIIIA and IIIB. After the oxide layer of B is grown in the host crystal lattice, magnetic ions are introduced to intermix with the B material. The magnetic ions may replace some of the ions of the B material. The process of growing additional stacked oxide layers of material A and B in the host crystal lattice and introducing further magnetic ions after the deposition of the oxide layer of B continues until a sufficient number of magnetic ions are sufficiently close to one another that they align in the same direction thereby forming a ferromagnetic oxide on the semiconductor material. As a result of forming an epitaxial layer of ferromagnetic oxide directly onto the semiconductor material, spin-polarized current may be efficiently injected from the ferromagnetic oxide into the semiconductor material.

As stated in the Background section, an impediment to the availability of commercially useful spintronic devices is that it has so far not been practical to generate strongly spin-polarized currents in semiconductor materials (often referred to as "spin injection"). When the spin-polarized currents flow from a ferromagnetic material into the semiconductor material, the electrons lose their polarization as they cross the interface between the two materials thanks to an "impedance mismatch" between the metal and the semiconductor. As a result, the efficiency of spin injection from ferromagnetic metals into semiconductors has been very low.

Figure 1:
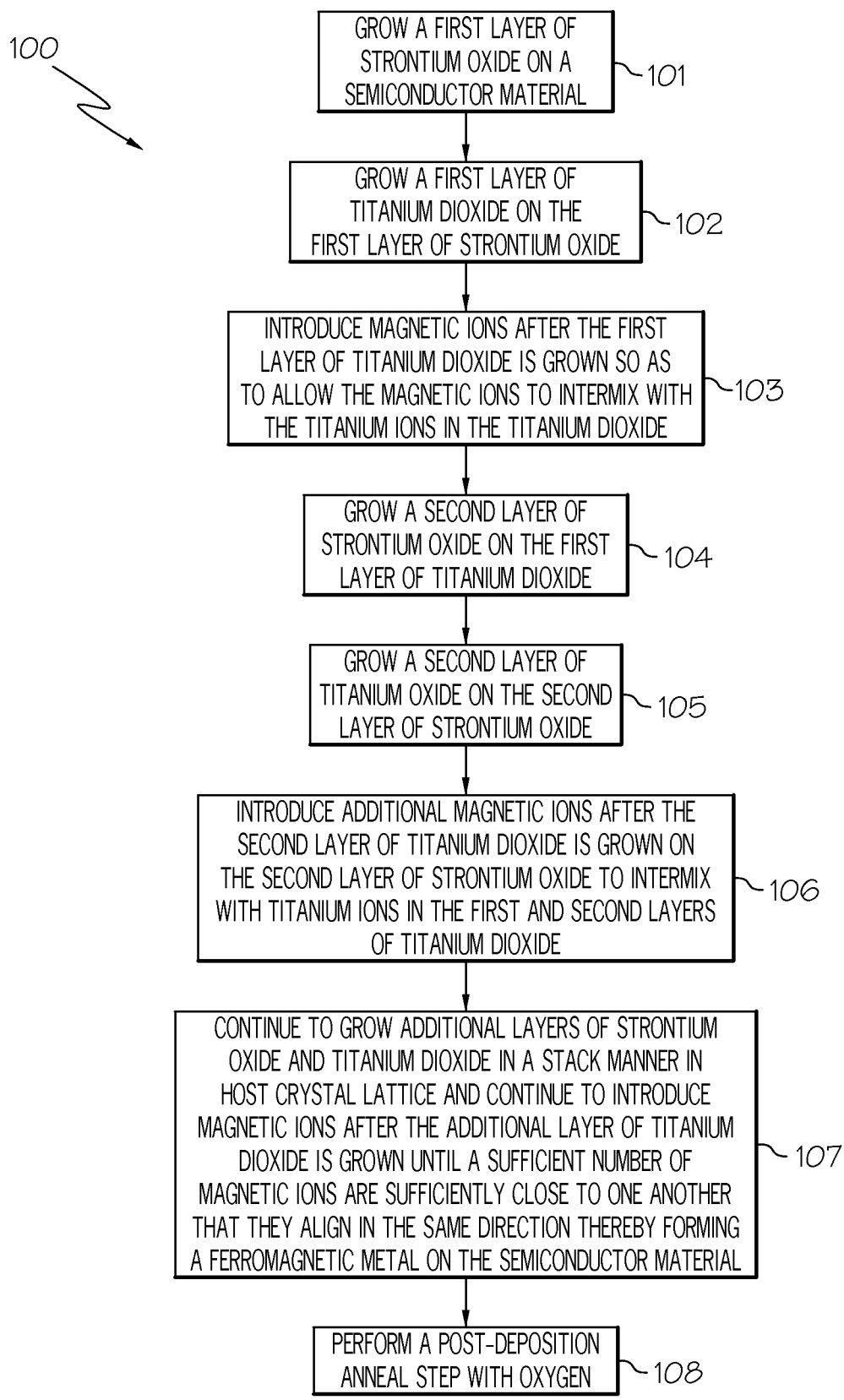
FIG. 1 is a flowchart of a method for forming a ferromagnetic oxide material on a semiconductor in accordance with an embodiment of the present invention.

The principles of the present invention provide a process for depositing an epitaxial crystalline ferromagnetic oxide directly onto the semiconductor material, such as silicon, without any interfacial reactions thereby allowing spin-polarized current to be injected into the semiconductor material with a much higher efficiency as discussed below in connection with FIGS. 1, 2A-2H, 3A-3B and 4. FIG. 1 is a flowchart of a method for forming a ferromagnetic oxide material on a semiconductor that allows spin-polarized current to be injected into the semiconductor material with a much higher efficiency. FIGS. 2A-2H depict cross-sectional views of a spintronic device during the process steps described in FIG. 1. FIGS. 3A and 3B illustrate the planes of strontium oxide and titanium dioxide, respectively, that are formed in a host crystal lattice. FIG. 4 illustrates a host crystal lattice used as a host for forming an epitaxial crystalline ferromagnetic oxide on the semiconductor material.

Referring now to the Figures in detail, FIG. 1 is a flowchart of a method 100 for forming a ferromagnetic oxide material on a semiconductor in accordance with an embodiment of the present invention. FIG. 1 will be discussed in conjunction with FIGS. 2A-2H which depict cross-sectional views of a spintronic device during the process steps described in FIG. 1 in accordance with an embodiment of the present invention. While FIG. 1 discusses a process of forming a ferromagnetic oxide material on a semiconductor using strontium oxide and titanium dioxide, the principles of the present invention apply to using a crystal lattice with a perovskite oxide structure with a formula of $ABO_3$, where A includes an alkaline earth metal or a group IIIA metal (e.g., strontium, barium, lanthanum and calcium) and B includes one of the metals from groups IVA, VIIIA and IIIB (e.g., titanium, aluminum, cobalt and hafnium). A person of ordinary skill in the art would be capable of applying the principles of the present invention to such implementations.

Figure 2A:
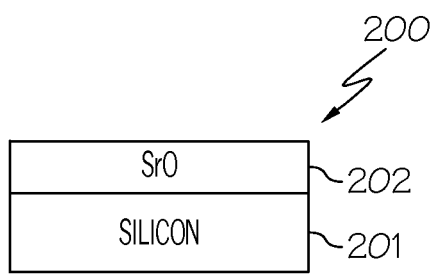
FIGS. 2A-2H depict cross-sectional views of a spintronic device during the process steps described in FIG. 1 in accordance with an embodiment of the present invention.

Referring now to FIG. 1, in conjunction with FIGS. 2A-2H, in step 101, a first layer of strontium oxide (SrO) is grown on a semiconductor material, such as silicon, as illustrated in FIG. 2A. Referring to FIG. 2A, a layer of strontium oxide 202 is grown directly on silicon 201 to fabricate a spintronic device 200. In one embodiment, the strontium oxide is grown using molecular beam epitaxy. As will be discussed in further detail below, a crystal lattice of stacked strontium oxide and titanium dioxide ($TiO_2$) layers will be grown and used for forming an epitaxial crystalline ferromagnetic oxide. A depiction of a strontium oxide layer in such a crystal lattice is provided in FIG. 3A.

Referring to FIG. 3A, FIG. 3A illustrates a plane 301 of strontium oxide which consists of strontium (Sr) and oxygen (O) in accordance with an embodiment of the present invention. Plane 301 of strontium oxide represents the first and each subsequent layer (discussed further herein) of strontium oxide that is grown in a crystal lattice (discussed further below in connection with FIG. 4).

Figure 2B:
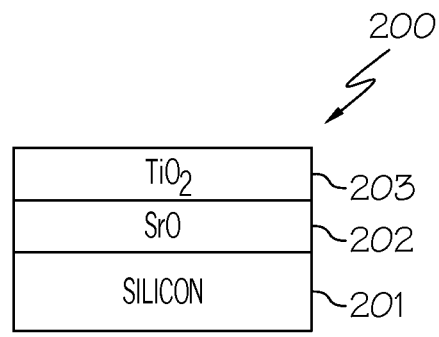

Returning to FIG. 1, in conjunction with FIGS. 2A-2H, in step 102, a first layer of titanium dioxide ($TiO_2$) is grown on the first layer of strontium oxide as illustrated in FIG. 2B. Referring to FIG. 2B, a layer of titanium dioxide 203 is grown on the layer of strontium oxide 202. In one embodiment, the titanium dioxide is grown using molecular beam epitaxy. As discussed above, a crystal lattice of stacked strontium oxide and titanium dioxide layers will be grown and used for forming an epitaxial crystalline ferromagnetic oxide. A depiction of a titanium dioxide layer in such a crystal lattice is provided in FIG. 3B.

Referring to FIG. 3B, FIG. 3B illustrates a plane 302 of titanium dioxide which consists of titanium (Ti) and oxygen (O) in accordance with an embodiment of the present invention. Plane 302 of titanium represents the first and each subsequent layer (discussed further herein) of titanium dioxide that is grown in a crystal lattice as illustrated in FIG. 4.

Referring to FIG. 4, FIG. 4 illustrates a crystal lattice 400 used as a host to form a crystalline ferromagnetic oxide in accordance with an embodiment of the present invention. Crystal lattice 400 depicts the first layers of strontium oxide and titanium dioxide stacked on top of another. As shown in FIG. 4, plane 302 of titanium dioxide is stacked on top of plane 301 of strontium oxide. The stack of plane 302 on top of plane 301 may be referred to as a "set." Further sets of strontium oxide and titanium dioxide may be added to crystal lattice 400 as discussed further below.

Figure 2C:
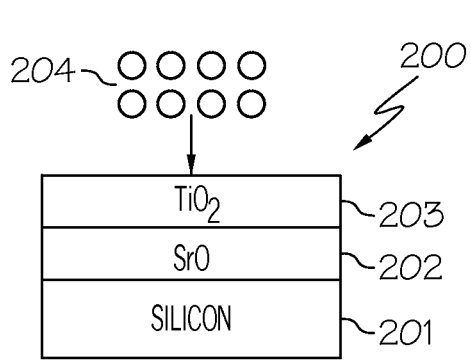

Returning to FIG. 1, in conjunction with FIGS. 2A-2H, in step 103, magnetic ions are introduced after the first layer of titanium dioxide ($TiO_2$) is grown so as to allow the magnetic ions to intermix with the titanium ions in the titanium dioxide as illustrated in FIG. 2C. Referring to FIG. 2C, metallic ions 204 are introduced to be intermixed with the titanium ions in the titanium dioxide 203. In the process of intermixing, some of these magnetic ions may replace some of the titanium ions in the titanium dioxide. For instance, referring to FIG. 3B, some of the titanium ions (Ti) would be replaced with the metallic ions. In one embodiment, metallic ions are cobalt. In another embodiment, the metallic ions may include any one of the following: chromium, iron, nickel, manganese, cobalt, gadolinium and europium. In one embodiment, any metal may be used to be introduced in step 103 that is comparable in size to the titanium atoms.

Figure 2D:
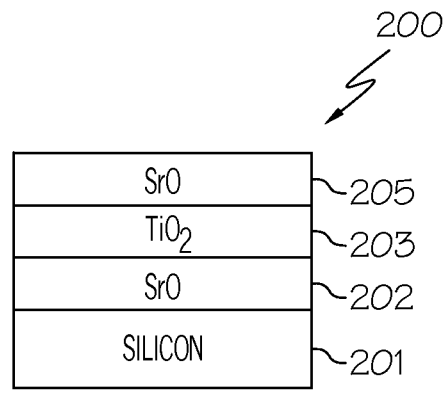

The steps of 101-103 are repeated in the manner described below. In step 104, a second layer of strontium oxide is grown on the first layer of titanium dioxide following the introduction of the magnetic ions in step 103 as illustrated in FIG. 2D. Referring to FIG. 2D, a layer of strontium oxide 205 is grown directly on the layer of titanium dioxide 203.

Figures 2E, 2F:
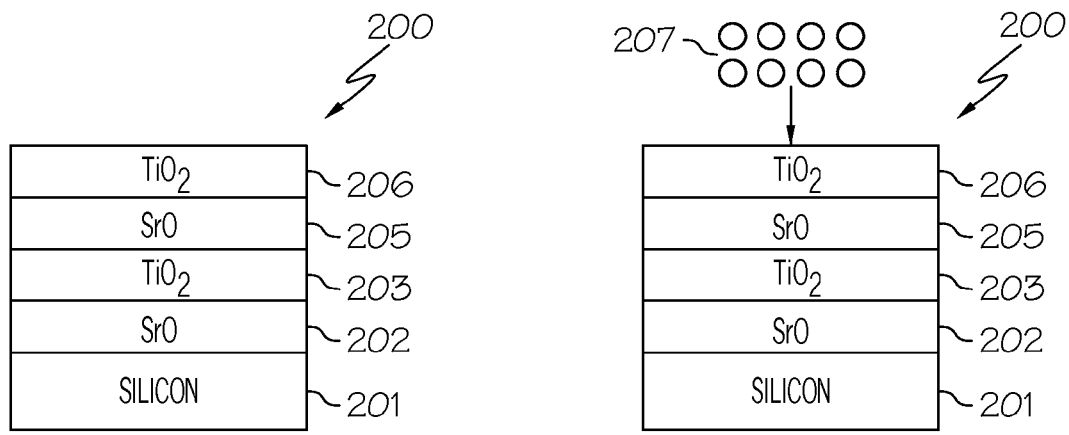

In step 105, a second layer of titanium dioxide is grown on the second layer of strontium oxide as illustrated in FIG. 2E. Referring to FIG. 2E, a layer of titanium dioxide 206 is grown directly on the layer of strontium oxide 205.

As discussed above, each layer of strontium oxide may be represented by plane 301 in FIG. 3A and each layer of titanium dioxide may be presented by plane 302 in FIG. 3B. Each of these planes are stacked on top of another as shown in FIG. 4 in crystal lattice 400 where crystal lattice 400, after step 105, would now include plane 302 stacked on top of plane 301 which is stacked on top of another plane 302 which is stacked on top of another plane 301.

After growing each titanium dioxide layer, magnetic ions are introduced to have the magnetic ions intermix with the titanium ions in the titanium dioxide, including the titanium ions in previously grown layers of titanium dioxide.

In step 106, additional magnetic ions are introduced after the second layer of titanium dioxide 206 is grown so as to allow the magnetic ions to intermix with the titanium ions in the first and second layers of titanium dioxide 203, 206 as illustrated in FIG. 2F. Referring to FIG. 2F, additional metallic ions 207 are introduced to be intermixed with the titanium ions in the layers of titanium dioxide 203, 206. In the process of intermixing, some of these magnetic ions may replace some of the titanium ions in the titanium dioxide 203, 206.

Figures 2G, 2H:
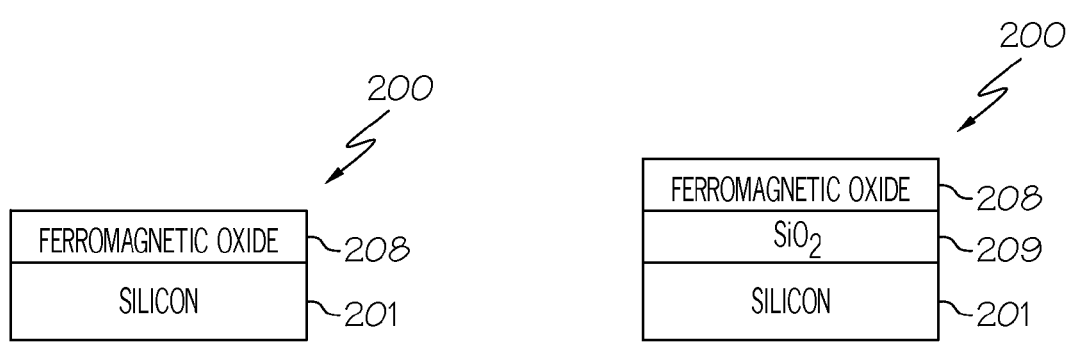

In step 107, steps 104-106 are repeated where additional layers of strontium oxide (represented by plane 301 of FIG. 3A) and titanium dioxide (represented by plane 302 of FIG. 3B) are grown in a stack manner as discussed above in host crystal lattice 400 (FIG. 4) and where magnetic ions are continued to be introduced after the additional layer of titanium dioxide is grown until a sufficient number of magnetic ions are sufficiently close to one another that they align in the same direction thereby forming an epitaxial crystalline ferromagnetic oxide on the semiconductor material (e.g., silicon 201) as illustrated in FIG. 2G. Referring to FIG. 2G, an epitaxial layer of ferromagnetic oxide 208 is formed on silicon 201 after a sufficient number of magnetic ions are sufficiently close to one another that they align in the same direction.

As a result of forming an epitaxial layer of ferromagnetic oxide 208 directly onto the semiconductor material (e.g., silicon 201), spin-polarized current may be efficiently injected from ferromagnetic oxide 208 into the semiconductor material (e.g., silicon 201).

In one embodiment, magnetic ions are cobalt. The concentration of intermixing cobalt (Co) with titanium dioxide is represented by $Ti_{1-x}Co_xO_2$, where the cobalt ions align in the same direction when x is between 0.1 and 0.5.

In one embodiment, process 100 occurs with a temperature between room temperature and 800° C.

In one embodiment, the first layers of strontium oxide 202 and titanium dioxide 203 are deposited using molecular beam epitaxy. The additional layers of strontium oxide and titanium dioxide may be deposited using other techniques, such as pulsed laser deposition.

In the case of spintronic device 200 having a tunneling structure, process 100 proceeds with performing a post-deposition anneal step with oxygen in step 108 to form a silicon dioxide layer on the semiconductor material (e.g., silicon 201) as illustrated in FIG. 2H. Referring to FIG. 2H, a silicon dioxide ($SiO_2$) layer 209 is formed on top of silicon 201 after the epitaxial layer of ferromagnetic oxide 208 has been formed. The thickness of the silicon dioxide layer can be controlled by temperature and pressure.

In some implementations, method 100 may include other and/or additional steps that, for clarity, are not depicted. Further, in some implementations, method 100 may be executed in a different order presented and that the order presented in the discussion of FIG. 1 is illustrative. Additionally, in some implementations, certain steps in method 100 may be executed in a substantially simultaneous manner or may be omitted.

Although the method and spintronic device are described in connection with several embodiments, it is not intended to be limited to the specific forms set forth herein, but on the contrary, it is intended to cover such alternatives, modifications and equivalents, as can be reasonably included within the spirit and scope of the invention as defined by the appended claims.

The invention claimed is:

1. A spintronic device comprising:
a semiconductor material; and
an epitaxial layer of crystalline ferromagnetic oxide in contact with said semiconductor material.

2. The spintronic device as recited in claim 1, wherein said semiconductor material comprises silicon.

3. The spintronic device as recited in claim 1, wherein said epitaxial layer of crystalline ferromagnetic oxide is formed by inserting magnetic ions in a host crystal lattice.

4. The spintronic device as recited in claim 3, wherein said host crystal lattice is a perovskite oxide structure with a formula of $ABO_3$, wherein said A comprises one of an alkaline earth metal and a group IIIA metal, wherein said B comprises one of the metals from groups WA, VIIIA and IIIB, wherein said host crystal lattice comprises sets of oxide layers of A and B stacked on top of one another.

5. The spintronic device as recited in claim 4, wherein said magnetic ions comprise cobalt.

6. The spintronic device as recited in claim 5, wherein said B comprises titanium, wherein said cobalt ions intermix with titanium dioxide which is represented by $Ti_{1-x}Co_xO_2$, wherein said cobalt ions align in a same direction when x is greater than 0.1.

7. The spintronic device as recited in claim 3, wherein said magnetic ions comprise one of the following: chromium, iron, nickel, manganese, cobalt, gadolinium and europium.

8. A spintronic device comprising:
  a semiconductor material;
  a silicon dioxide layer in contact with said semiconductor material; and
  an epitaxial layer of crystalline ferromagnetic oxide in contact with said silicon dioxide layer;
  wherein said silicon dioxide layer is formed after said epitaxial layer of crystalline ferromagnetic oxide is formed.

9. The spintronic device as recited in claim 8, wherein said semiconductor material comprises silicon.

10. The spintronic device as recited in claim 8, wherein said epitaxial layer of crystalline ferromagnetic oxide is formed by inserting magnetic ions in a host crystal lattice.

11. The spintronic device as recited in claim 10, wherein said host crystal lattice comprises sets of strontium oxide and titanium dioxide layers stacked on top of one another.

12. The spintronic device as recited in claim 11, wherein said magnetic ions comprise cobalt.

13. The spintronic device as recited in claim 12, wherein said cobalt ions intermix with said titanium dioxide which is represented by $Ti_{1-x}Co_xO_2$, wherein said cobalt ions align in a same direction when x is greater than 0.1.

14. The spintronic device as recited in claim 10, wherein said magnetic ions comprise one of the following: chromium, iron, nickel, manganese, cobalt, gadolinium and europium.

* * * * *